(12) United States Patent
Paul et al.

(10) Patent No.: US 6,934,924 B2
(45) Date of Patent: Aug. 23, 2005

(54) LAYOUT METHODOLOGY AND SYSTEM FOR AUTOMATED PLACE AND ROUTE

(75) Inventors: Gideon Paul, Modi'in (IL); Evgeny Grigoryantz, Jerusalem (IL)

(73) Assignee: Terachip Inc., Palo Alto, CA (US)

( * ) Notice: Subject to any disclaimer, the term of this patent is extended or adjusted under 35 U.S.C. 154(b) by 145 days.

(21) Appl. No.: 10/447,946

(22) Filed: May 30, 2003

(65) Prior Publication Data

US 2004/0153985 A1 Aug. 5, 2004

Related U.S. Application Data

(60) Provisional application No. 60/443,847, filed on Jan. 31, 2003.

(51) Int. Cl.$^7$ .............................. G06F 17/50
(52) U.S. Cl. .................. 716/11; 5/8; 5/10; 5/12; 5/13; 5/14
(58) Field of Search .................. 716/1, 2, 3, 5, 716/8–14; 327/565; 257/203, 206

(56) References Cited

U.S. PATENT DOCUMENTS

| | | | |
|---|---|---|---|
| 5,595,843 A | | 1/1997 | Dao |
| 5,620,816 A | | 4/1997 | Dao |
| 5,635,316 A | | 6/1997 | Dao |
| 5,987,240 A | * | 11/1999 | Kay .............................. 716/5 |
| 6,114,903 A | * | 9/2000 | Bach .......................... 327/565 |
| 6,295,627 B1 | * | 9/2001 | Gowni et al. ................... 716/1 |
| 6,374,395 B1 | | 4/2002 | Wang |
| 6,453,447 B1 | * | 9/2002 | Gardner et al. ................. 716/3 |
| 6,587,992 B2 | * | 7/2003 | Marple .......................... 716/2 |
| 6,823,500 B1 | * | 11/2004 | Ganesh et al. ................. 716/9 |
| 2004/0211982 A1 | * | 10/2004 | Li et al. ...................... 257/203 |

* cited by examiner

*Primary Examiner*—Vuthe Siek
(74) *Attorney, Agent, or Firm*—Sughrue Mion, PLLC

(57) ABSTRACT

A new simple novel Layout methodology for high integration VLSI chip is proposed, which is reduced dramatically the complexity, the cost and the schedule for implementing a complex chip such as System On a Chip (SOC) that required hierarchical layout implementation. A set of rules is provided for the place and route process.

22 Claims, 4 Drawing Sheets

LAYOUT METHODOLOGY AND SYSTEM FOR AUTOMATED PLACE AND ROUTE

This application claims benefit to provisional U.S. Application Ser. No. 60/443,847, filed on Jan. 31, 2003, the contents of which are incorporated herein by reference.

BACKGROUND OF THE INVENTION

1. Field of the Invention

The present invention relates to a method and system for performing automated placing and routing (P&R). More specifically, the present invention relates to a set of rules for improving the process of conducting automated place and route.

2. Related Art

In the related art System On a Chip (SOC), and for other big chips built in very large scale integration (VLSI), cost and time to market are very important criteria for determining effectiveness. The related art SOC have become bigger, and may include tens of millions of transistors that result in very complex floor planning, with many sub blocks in a hierarchy. Accordingly, a different approach is needed for the layout implementation for the larger related art SOC, as compared with a completely flat layout of relatively small related art VLSI chips.

Related art place and route (P&R) automated tools give a complete and relatively good solution for sub micron technology chip layout, if the chip layout can be done by one flat netlist. However, in SOC, the efficiency of the P&R tools is very poor if they are used for millions of cells as one hierarchy. As a result, it is desirable to implement such chips with relatively few sub blocks, each sub-block being built completely by the P&R tool, rather than combining all of the sub-blocks together in the Top Level of the chip, either by the P&R tool or manually, to build the complete chip.

However, the foregoing related art layout scheme has various problems and disadvantages. For example, but not by way of limitation, a substantial amount of layout work is needed to build the chip layout in hierarchy or by sub blocks, and significant human resources are required. Many related art layout methodologies can do this work, each tool depending on the specific layout requirements. There are also common related art layout methodologies related to the chip that are designed from block "type". Those related art approaches result in a relatively long work process, until the related art SOC layout is completed. These related art approaches depend on at least chip size, speed of operation, complexity of the integration and amount of routing and power consumption.

In a related art layout methodology, a VLSI chip is built by sub block, and not as a flattened chip. As a result, there are at least the following disadvantageous bottlenecks. First, each sub block is designed as a separated stand-alone unit, which results in overhead. Further, each block power strip line needs to be designed in a customized way to improve efficiency. For example, but not by way of limitation, in each block that contains a memory, additional resources must be devoted to the issue of how to integrate this memory cell. As a result, a non-optimum layout of resources is produced (e.g., in terms of area, pins location and routing resources).

Additionally, there is a related art problem when combining all sub blocks together, which results in a layout penalty due to the blocks. For example, but not by way of limitation, there is a different aspect ratio, surrounding of power and ground metals, rings and pins location inside the power rings. Also, input/output (IO's) and IP cell integration usually require a relatively long time.

With related art method and P&R tools, a team of 8 Engineers will need to work for 6 months to complete the layout of the VLSI chip, which is a disadvantage of the related art.

SUMMARY OF THE INVENTION

It is an object of the present invention to significantly reduce the layout schedule (e.g., to 4 months), and the layout implementation complexity for SOC technology.

It is another object of the present invention to minimized required human resources (e.g., only one engineer, as opposed to eight engineers) to complete the chip layout, and to complete the entire project.

It is also an object of the present invention to develop a robust, simple, and reusable place and route method, without any limitation based on chip block type, size or number of blocks.

It is a still further object of the present invention to reduce the chip die area compared with the related art.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

To achieve at least the foregoing objects, a simple, novel and unique layout methodology is provided for a fully automated place and route (P&R) tool, that permits building of a SOC layout that previously required many sub blocks in the related art. The present invention operates in a very efficient way that can result in better than ⅙ (e.g., average of about ¹⁄₁₀) of the time and cost comparing to the related art layout methodologies used in by today's ASIC vendors to implement SOC VLSI chips.

The novel method according to the present invention meets the requirements of very fast time to market with a limited human resources, and targets 0.13 um process (Deep Sub Micron).

The novel methodology of the present invention saves time and resolves, by design, the related art sub micron technology issues. The present invention is fully compatible with standard P&R tools, and covers sub micron (e.g., 0.13 um) process issues, including (but not limited to) Timing and Cross Talk, Long Signal RC, Voltage Drop (IR.D), Electro Migration, Noise, Cells Power distribution, Latch-Up, Hot Electron, ESD, Antenna and Clocks.

Figure 1:
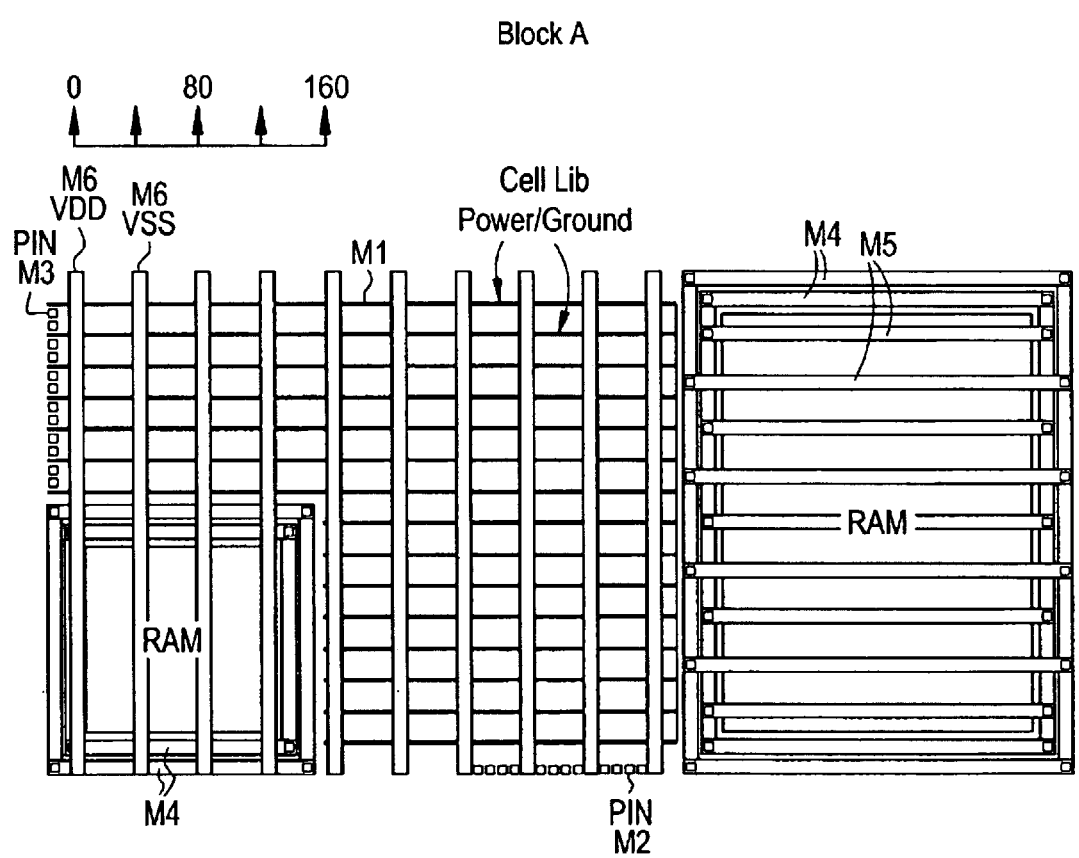
FIG. 1 illustrates a block level layout according to an exemplary, non-limiting embodiment of the present invention.
Figure 2:
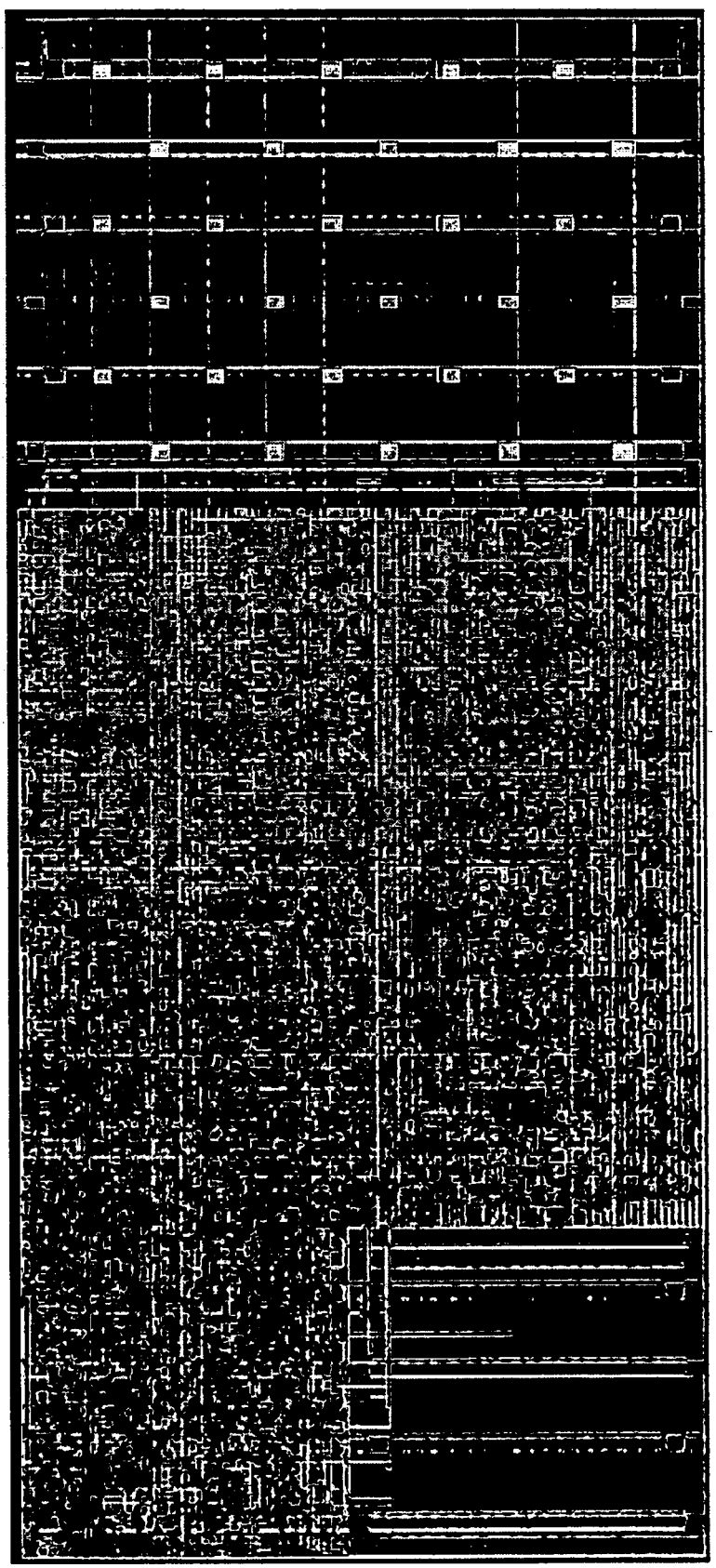
FIG. 2 illustrates a real block level layout methodology according to an exemplary, non-limiting embodiment of the present invention.

FIGS. 1 and 2 illustrate a block formed according to the rules of the present invention. A chip is produced having at least approximately 80 blocks in the Top Level running in the few hundreds of megahertz, including (but not limited to) Mixed Signal blocks, tens of memory cells and total of about 30 million transistors. While this design is complex, the novel closed layout methodology of the present invention allows for production of the layout without requiring layout cycles for fixing timing or other signal integrity issues.

The use of the new methodology helps give the designers and the P&R tool a set of simple rules that substantially resolve the related art design signal integrity and timing issues, result in very quick, clean layout output (i.e., no need of many cycles for fixing) and saves silicon area. The rules form a novel feature of the present invention, and are described in greater detail below.

One of the first issues in VLSI chip layout design is to define a purpose for each metal layer. This task is not simple, and accounts for substantially all of the chip layout influences. An exemplary embodiment is disclosed for an 8 metal layer process, but the present invention is not limited thereto. For example, but not by way of limitation, the metal layers could be allocated differently with the same layout methodology.

In the present invention, a layout method is provided for automated place and route. The method involves the application of a number of rules. These rules are developed according to various categories, and then are applied (for example, in software) to produce the desired layout). First, the general chip metal layer rules are described, followed by the block level rules. Next, the memory rules are formed, and then, the top level rules. Further, the clock rules are then formed, after which the IO rules are formed. The formation of each of these types of rules is described below, as well as the related art problem solved.

General Metal Chip Layers

In this exemplary, non-limiting description, metal layers M1, M3, M5 and M7 constitute horizontal metals, and metal layers M2, M4, M6 and M8 constitute vertical metals. For top-level routing, M7 and M8 can be used also to route over the blocks.

Further, according to the methodology of the presently claimed invention, routing channels for top level routing may use metal layers M1 through M8. All of the metal layers may be used for routing between blocks to produce the layout.

Also, in the exemplary embodiment, it is noted that routing above memories can be done only on metal layers that are not used by the memories. As a result, the present invention discloses that routing above memories can be performed at metal layers M5 through M8. Additionally, a metal-redistribution MD bump layer M9 is provided for the input/output (I/O) bumpers, and bump connections.

Block Level

The block level methodology according to an exemplary, non-limiting embodiment of the present invention is discussed below. At the block level, metal layers M1 through M6 are used for internal block routing. The use of metal layers M1 through M6 enables sufficient routing resources for a complex block.

Additionally, the metal layer M6 is used for power strips (VDD and VSS). For example, but not by way of limitation, a spacing of xx um and width of xx um spacing (constant for all blocks) may be provided. For example, but not by way of limitation, in this non-limiting, exemplary embodiment, 80 um may be used for "xx". However, the present invention is not limited thereto. In the present invention, the width and space of the metal layer (e.g., M6) is based on the type of library used for the P & R tool, as well as the density of the logic cells and the power supplied. Accordingly, the metal width and the space design meets the total allowable voltage drive (i.e., IR.D).

The pins at the block level are allocated horizontally to metal layers M2/M4, and vertically to metal layers M3/M5. Further, 2x minimum spacing is provided, so that a simple interface to the block is provided without the related art blocking problems. To reduce the related art cross talk problem and its effects, critical paths or buses are run in 2x spacing.

At the block level, every input and output is sampled. As a result, the related art timing problems between blocks and the inputs/outputs is substantially eliminated. To substantially eliminate the related art antenna effect, a diode is added to all block inputs.

For the outputs, a buffer is used, having an exemplary size xX. As a result, the present invention enables a long signal drive (e.g., xxxx um) having a sufficient rise/fall time, without requiring an external buffer. For example, but not by way of limitation, in this non-limiting, exemplary embodiment, the exemplary size may be 12X, and the long signal drive may have a value of xxxx=3000 um. However, the present invention is not limited thereto.

To reduce the clock-to-out and set-up times for the block, inputs and outputs sampling flip-flops are positioned near the edge of the blocks, and near the pins. Further, internal block signals are limited to a rise/fall time of x.x nsec. For example, but not by way of limitation, in this non-limiting, exemplary embodiment, the exemplary rise-fall time may be 1.5 nsec. However, the present invention is not limited thereto.

Such a limitation prevents slow nodes, and reduces a pendency of the critical path. To reduce the related art noise effect, decoupling capacitors are used in free cell areas.

Memory integration

1401 Turning to the integration of memories, a methodology according to an exemplary, non-limiting embodiment of the present invention is disclosed herein, and an implementation thereof is illustrated in FIGS. 1 and 2. In the present invention, metal layer M4 (vertical and horizontal aspects) is used for power rings (e.g., xx um for VDD/NVSS). As a result, minimum blocking of signals is enabled in a manner that is simple to implement. Further, the metal layer M5 is used horizontally for power refresh. The width of this feature is xx um, and it is placed every xx um. As a result, a robust power supply is provided to the memory, and there is a reduced voltage drive (IR.D).

For example, but not by way of limitation, in this non-limiting, exemplary embodiment, the power rings may be 10 um for VDD/NVSS, the width of the metal layer M5 is 8 um, and it is spaced every 40 um. However, the present invention is not limited thereto.

Top Level

Figure 3:
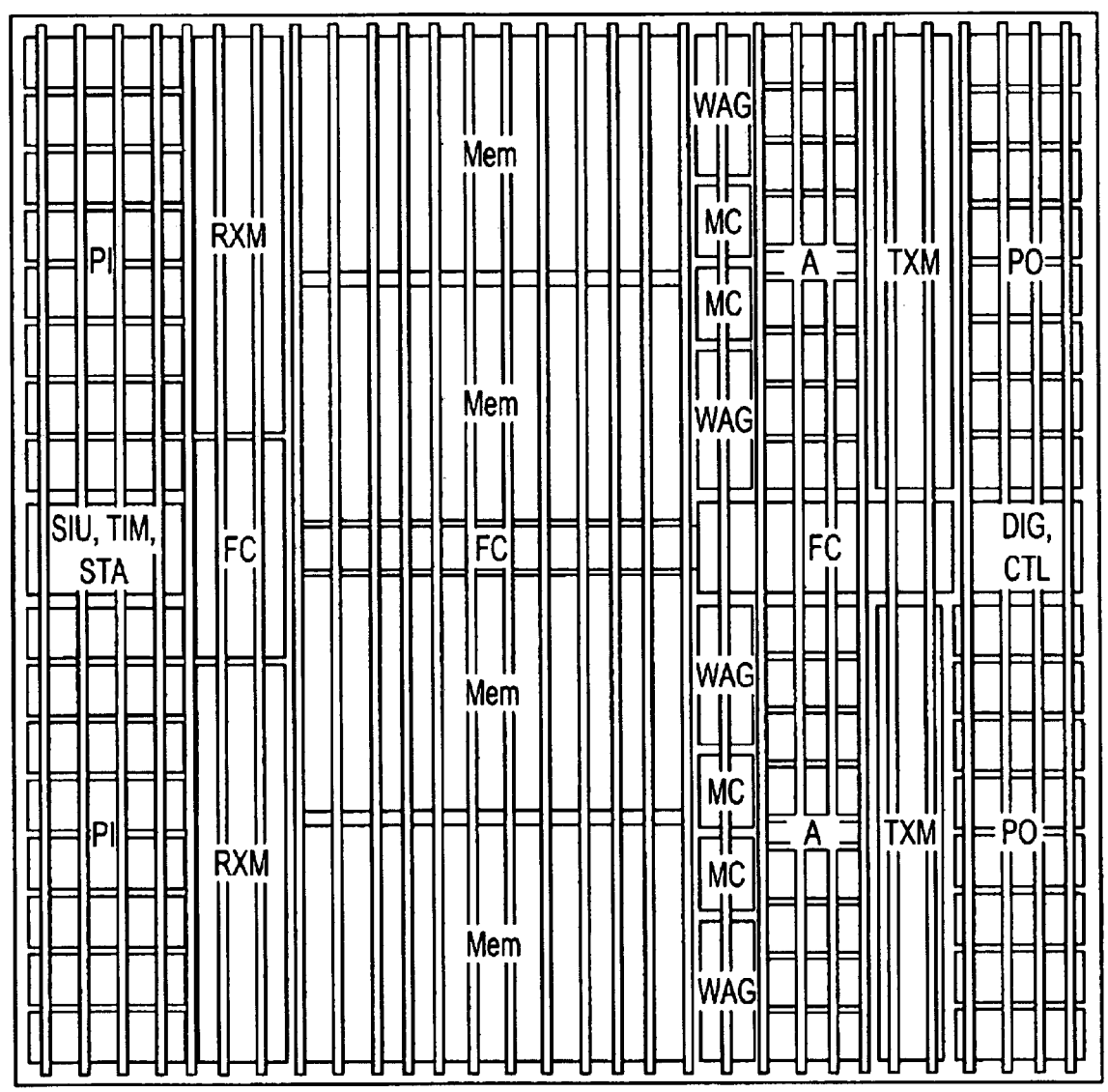
FIG. 3 illustrates a top level of the block layout for metal layer M6 an exemplary, non-limiting embodiment of the present invention.

FIG. 3 illustrates an implementation of the top-level methodology according to an exemplary, non-limiting embodiment of the present invention. In this methodology, a metal layer M6 is used for the power stripes (VDD and VSS), having a xx um width and xx um spacing. This is substantially the same power stripes that are done in the block design using the same rules. This portion of the methodology is a simple, easy process of integrating the blocks into the top level. Thus, there is no overhead of the power rings of a block. As a novel feature of the present invention, this aspect results in a substantial saving in terms of silicon space and development time.

For example, but not by way of limitation, in this non-limiting, exemplary embodiment, the metal layer M6 may have a width of 8 um and a spacing of 80 um. However, the present invention is not limited thereto.

Further, metal layers M7 and M8 are used for the power grid of VDD and VSS having xx um width and xx urn spacing. Such a design results in a lower driving voltage IR.D, and enables sufficient routing resources. For example, but not by way of limitation, in this non-limiting, exemplary embodiment, metal layers M7, M8 may have a 10 um width and 80 um spacing. However, the present invention is not limited thereto.

All buses and signals are routed with 2x spacing and 2x width. Such a routing scheme results in the elimination of the related art cross talk problem for long signals, as well as the related art electro-migration (EM) problem.

Buffers xX are inserted for the long signal every xxxx um. However, the present invention is not limited to those dimensions for insertion. These parameters are defined by SPICE simulation on prior stage. For example, but not by way of limitation, in this non-limiting, exemplary embodiment, the buffers are 12X and the long signal is every 3000 um. However, the present invention is not limited thereto.

As a result, the present invention is substantially protected from the related art timing violation problems at the top level. Further, buffer insertion limits the slow nodes, and substantially eliminates the related art hot electron effect.

To contribute to the substantial elimination of the related art EM effect, a minimum of two vias are used for buffer xX connections, and maximum rise/fall time for all interconnect signals is limited to about x.x nsec. For example, but not by way of limitation, in this non-limiting, exemplary embodiment, buffer may have 16X connections, and the maximum rise/fall may be limited to about 3.0 nsec. However, the present invention is not limited thereto.

Also, to prevent unsynchronized starting of each block, tree buffers are built for the RESET signal in the substantially same way as for clocks. Further, the RESET propagation time is limited to one System Clock.

A maximum of x buffers xX are placed in each slot of xx um, in between two strip lines of metal layer M6. As a result, the drive voltage IR.D is prevented on big buffers of the power lines. Also, similar to the aforementioned discussion, decoupling capacitors are used for any sensitive cell (such as Clock Buffers or Clock Generators) to reduce the noise effect.

For example, but not by way of limitation, in this non-limiting, exemplary embodiment, a maximum of 2 buffers x 16X may be placed in each slot of 80 um. However, the present invention is not limited thereto.

Clocks

Next, the methodology for implementing the clocks according to a non-limiting, exemplary embodiment of the present invention is described. A minimum of 2x spacing is used to route the block level and top level, to substantially eliminate the related art cross talk problems. Further, clock metal width should be designed according to specific EM and Delay requirements for the particular device for which the layout is being made.

At the block level, the clock maximum delay is x.x nsec and the maximum clock skew is xx psec, which simplifies top level clock tree design, and keeps a total skew on the clock small. As a result, the clock has a faster timing closure. Also, in the top level, the clock tree is generated with a balanced delay, and a total skew of xxx psec, thus eliminating the related art hold time violation (i.e., races) in the design.

For example, but not by way of limitation, in this non-limiting, exemplary embodiment, the clock maximum delay is 0.7 nsec and the maximum clock skew is 60 psec. However, the present invention is not limited thereto.

According to this exemplary embodiment of the present invention, the top level clock can be a balanced H-Tree and/or grid structure. Accordingly, a low skew clock tree is achieved. Also, in the top level, clock routing is performed with xx spacing, which substantially eliminates the related art cross talk problem for long signals. To prevent the aforementioned related art EM problem, all clock buffers are coupled with a minimum of x vias. For example, but not by way of limitation, in this non-limiting, exemplary embodiment, clock routing is performed with 4x spacing, and clock buffers are coupled with 2 vias. However, the present invention is not limited thereto.

IO

Turning to the IO portion of the methodology according to a non-limiting preferred embodiment of the present invention, each group or type of IO's has separated power supply dedicated pads. This feature substantially eliminates the cross talk and noise between bus problems experienced in the related art. Additionally, a pair of power pads is used for each x output signal that runs at xxx.x MHz, which substantially eliminates the related art problems associated with the ringing and the driving voltage IR.D on the pads.

For example, but not by way of limitation, in this non-limiting, exemplary embodiment, the pair of power pads is used for 4 output signals that run at about 200 MHz. However, the present invention is not limited thereto.

Further, as short a connection as possible of a minimum xx um width of metal is used to connect the ESD's to the internal Power Grid (i.e., metal layers M6, M7, M8, MD). Thus, the present invention ensures that the ESD will be functional, and the transistors are effectively protected. In the case of a Flip-Chip, an ESD bump connection is used directly to package the power plane, and the result is a minimum resistance between the ESD and the power grid. For example, but not by way of limitation, in this non-limiting, exemplary embodiment, the minimum width of metal may be 70 um. However, the present invention is not limited thereto.

The foregoing new layout methodology was implemented successfully with human resources time of ~1/10 comparing to general common methodologies, on a very high-end big SOC chip using the edge technology of 0.13 um, 9-Metal layers, 1.2/3.3v, 39 masks process with power consumption of 15W. This chip includes more than 80 sub blocks in the Top Level.

Figure 4:
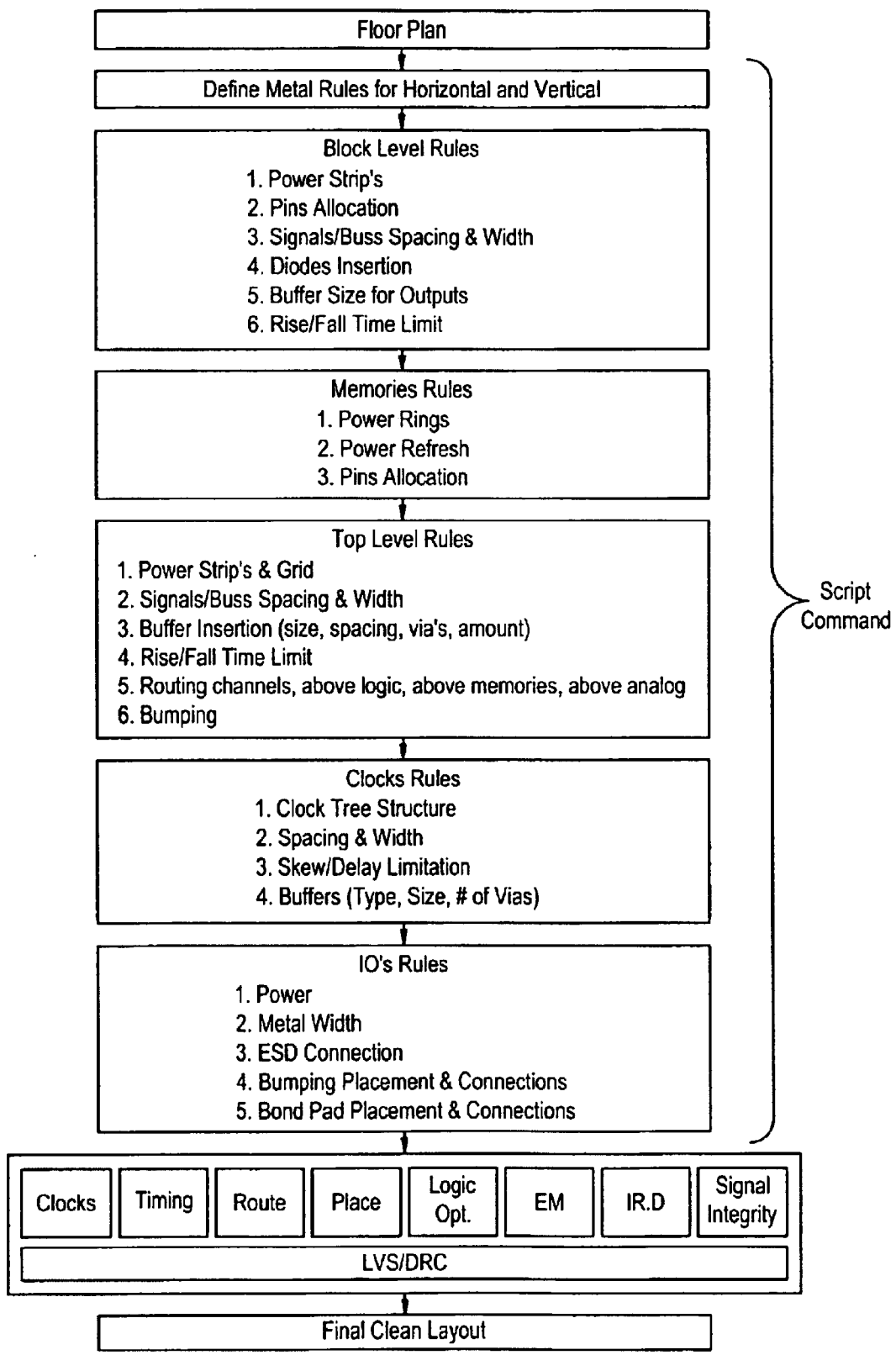
FIG. 4 illustrates a flow chart for the place and route process according to an exemplary, non-limiting embodiment of the present invention.

FIG. 4 illustrates a flow chart of the implementation of the aforementioned methodology. In a first step S1, the floor plan is provided for the place and route method, as is known in the art. Then, at step S2, metal rules are defined as shown above for the horizontal and vertical treatment of the metal layers. Next at step S3, block level rules are defined as discussed above, including (but not limited to) rules for the power strips, allocation of pins, signal and bus spacing and width, insertion of diodes, defining a buffer size for outputs, and setting a rise/fall time limit.

At step S4, memory rules are defined for power rings, power refresh and allocation of pins, as described in greater detail herein. Once the memory rules have been provided, then at step S5, the top level rules are defined. For example, but not by way of limitation, rules for the power strips and grid, spacing and width of the signals and bus, buffer insertion rules (e.g., size, spacing, vias and amount), a rise/fall time limit, routing of the channels (i.e., above logic, above memories and above analog), and bumping are defined. These rules are discussed in greater detail herein.

Once the top level rules have been provided as discussed above, the clock rules are defined at step S6. For example, but not by way of limitation, the clock rules can include, but are not limited to, clock tree structure, spacing and width, skew/delay limitation, and buffer parameters (e.g., type, size and number of vias).

After the top rules, at step S7, rules for the IO's are defined. These rules include, but are not limited to, rules that govern power, metal width, ESD connection, bumping placement and connections, and bond pad placement and connections.

The aforementioned steps S2 through S7 are implemented as a script, so that they may be performed in a computer readable medium as a software program. Thus, the rule generation of the place and route process is automated.

At step S8, a result of the foregoing script with the rules is generated, and the design operations are performed. The resulting final clean layout is generated at step S9. Thus, the design is completed and can be implemented according to the foregoing rules.

The present invention can be implemented as a set of instructions on a computer readable medium. For example, but not by way of limitation, the present invention may be included in a computer software program. The computer readable medium may include, but is not limited to, a dynamic or static built-in memory (e.g., ROM or hard drive), and/or a mobile memory device (e.g., memory stick, diskette or zip disk).

As an example of implementation, the new layout methodology can be used in Applicant's TCF1 (TCF16X10G1) chip, as well as new chips currently under development.

The present invention has various advantages over the related art. For example, but not by way of limitation, the new layout methodology has been developed such that it solves or reduced most of the main sources of area and human time consuming, resulting in a very simple quick and efficient layout.

Best mode embodiments have been explained above and are shown. However, the present invention is not limited to the preferred embodiment described above, and it is apparent that variations and modifications by those skilled in the art can be effected within the spirit and scope of the present invention defined in the appended claims. Therefore, the scope of the present invention is not determined by the above description but by the accompanying claims.

What is claimed is:

1. A method of producing a clean layout from a floor plan for a VLSI chip, comprising the steps of:
    (a) defining metal rules for horizontal and vertical treatment of a plurality of metal layers;
    (b) defining block level rules for power strips, allocation of pins, signal and bus spacing and width, insertion of diodes, defining a buffer size for outputs, and setting a rise/fall time limit;
    (c) defining memory rules for power rings and power refresh;
    (d) defining top level rules for the power strips and a grid, said signal and bus spacing and width, buffer insertion rules for size, spacing, vias and amount, a rise/fall time limit, routing of the channels above logic, above memories and above analog, and bumping;
    (e) defining clock rules for clock tree structure, spacing and width, skew/delay limitation, and buffer parameters including; and
    (f) defining rules for the IO's, including rules governing power, metal width, ESD connection, bumping placement and connections, and bond pad placement and connections.

2. The method of claim 1, wherein said metal rules generated by said (a) comprise even metal layers as horizontal metals, and odd metal layers are vertical metals, one said even metal layers and one of said odd metal layers are used to route over blocks, and wherein routing above memories uses upper metal layers, and a metal-redistribution (MD) bump is provided for input/output connections and bump connections at a metal layer above said horizontal metals and said vertical metals.

3. The method of claim 1, wherein said (b) comprises using metal layers M1 through M6 for internal block routing, using metal layer M6 power strips (VDD and VSS), and wherein the width and space of the metal layer M6 is based on a type of library used for place and route, density of the logic cells and power supplied, such that metal width and space design meets a total permissible voltage drive requirement.

4. The method of claim 3, said block level rules generated by said (b) further comprising allocating the pins horizontally to metal layers M2/M4, and vertically to metal layers M3/M5, providing 2x minimum spacing, running critical paths or buses in 2x spacing, sampling every input and output of the block, and adding a diode to all block inputs.

5. The method of claim 4, said block level rules generated by said (b) further comprising using a buffer of a prescribed size so that no external buffer is required for a long drive signal, placing sampling flip-flops near the edge of the blocks and near the pins, limiting internal block signals are limited to a prescribed rise/fall time, and using decoupling capacitors in free cell areas.

6. The method of claim 1, said memory rules generated by said (c) further comprising using the metal layer M4 (vertical and horizontal aspects) for power rings, and the metal layer M5 horizontally for power refresh.

7. The method of claim 1, said top level rules generated by said (d) comprising using a metal layer M6 is used for the power strip so that there is no overhead of the power rings of a block, using metal layers M7 and M8 for the power grid of VDD and VSS, routing all buses and signals with 2x spacing and 2x width, inserting buffers for the long signal at a prescribed interval, using at least two vias for all buffer connections so as to limit maximum rise/fall time for all interconnect signals to a prescribed time interval, wherein tree buffers are built for the RESET signal in the substantially same way as for clocks, and RESET propagation time is limited to one System Clock interval.

8. The method of claim 7, said top level rules generated by said (d) further comprising placing a maximum number of buffers in each slot, in between two strip lines of metal layer M6, and using decoupling capacitors for any sensitive cell.

9. The method of claim 1, said clock level rules generated by said (e) comprising using a minimum of 2x spacing to route the block level and top level, designing clock metal width according to specific EM and Delay requirements for the particular device for which the layout is being made, setting maximum clock delay and skew to respect prescribed maximum intervals, generating the clock tree with a balanced delay, and a prescribed total skew.

10. The method of claim 9, said clock level rules generated by said (e) further comprising having the top level clock as a balanced H-Tree and/or grid structure, performing clock routing with a prescribed spacing, and connecting all clock buffers with a minimum number of vias.

11. The method of claim 1, said IO level rules generated by said (f) comprising each group or type of IO's having separated power supply dedicated pads, using one pair of power pads is used for each output signal that runs at a prescribed frequency, minimizing a length of a connection to connect the ESD's to the internal Power Grid (M6, M7, M8, MD), and in the case of a Flip-Chip, using an ESD bump connection directly to the package the power plane.

12. A computer-readable medium configured to implementing a series of instructions for producing a clean layout from a floor plan for a VLSI chip, said instructions comprising:

(a) implementing metal rules for horizontal and vertical treatment of a plurality of metal layers;

(b) implementing block level rules for power strips, allocation of pins, signal and bus spacing and width, insertion of diodes, defining a buffer size for outputs, and setting a rise/fall time limit;

(c) implementing memory rules for power rings, power refresh and allocation of pins;

(d) implementing top level rules for the power strips and a grid, said signal and bus spacing and width, buffer insertion rules for size, spacing, vias and amount, a rise/fall time limit, routing of the channels above logic, above memories and above analog, and bumping;

(e) implementing clock rules for clock tree structure, spacing and width, skew/delay limitation, and buffer parameters including; and (f) implementing rules for the IO's, including rules governing power, metal width, ESD connection, bumping placement and connections, and bond pad placement and connections.

13. The computer-readable medium of claim 12, wherein said metal rules generated by said (a) comprise even metal layers as horizontal metals, and odd metal layers are vertical metals, said routing channels use any of the metal layers for routing between blocks, and wherein routing above memories uses upper metal layers, and a metal-distribution (MD) bump is provided for input/output connections and bump connections at a metal layer above said horizontal metals and said vertical metals.

14. The computer-readable medium of claim 12, wherein said (b) comprises using metal layers M1 through M6 for internal block routing, using metal layer M6 power strips (VDD and VSS), and wherein the width and space of the metal layer M6 is based on a type of library used for place and route, density of the logic cells and power supplied, such that metal width and space design meets a total permissible voltage drive requirement.

15. The computer-readable medium of claim 14, said block level rules generated by said (b) further comprising allocating the pins horizontally to metal layers M2/M4, and vertically to metal layers M3/M5, providing 2x minimum spacing, running critical paths or buses in 2x spacing, sampling every input and output of the block, and adding a diode to all block inputs.

16. The computer-readable medium of claim 15, said block level rules generated by said (b) further comprising using a buffer of a prescribed size so that no external buffer is required for a long drive signal, placing sampling flip-flops near the edge of the blocks and near the pins, limiting internal block signals are limited to a prescribed rise/fall time, and using decoupling capacitors in free cell areas.

17. The computer-readable medium of claim 12, said memory rules generated by said (c) further comprising using the metal layer M4 (vertical and horizontal aspects) for power rings, and the metal layer M5 horizontally for power refresh.

18. The computer-readable medium of claim 12, said top level rules generated by said (d) comprising using a metal layer M6 is used for the power strip so that there is no overhead of the power rings of a block, using metal layers M7 and M8 for the power grid of VDD and VSS, routing all buses and signals with 2x spacing and 2x width, inserting buffers for the long signal at a prescribed interval, using at least two vias for all buffer connections so as to limit maximum rise/fall time for all interconnect signals to a prescribed time interval, wherein tree buffers are built for the RESET signal in the substantially same way as for clocks, and RESET propagation time is limited to one System Clock interval.

19. The computer-readable medium of claim 18, said top level rules generated by said (d) further comprising placing a maximum number of buffers in each slot, in between two strip lines of metal layer M6, and using decoupling capacitors for any sensitive cell.

20. The computer-readable medium of claim 12, said clock level rules generated by said (e) comprising using a minimum of 2x spacing to route the block level and top level, designing clock metal width according to specific EM and Delay requirements for the particular device for which the layout is being made, setting maximum clock delay and skew to respect prescribed maximum intervals, generating the clock tree with a balanced delay, and a prescribed total skew.

21. The computer-readable medium of claim 20, said clock level rules generated by said (e) further comprising having the top level clock as a balanced H-Tree and/or grid structure, performing clock routing with a prescribed spacing, and connecting all clock buffers with a minimum number of vias.

22. The computer-readable medium of claim 12, said IO level rules generated by said (f) comprising each group or type of IO's having separated power supply dedicated pads, using one pair of power pads is used for each output signal that runs at a prescribed frequency, minimizing a length of a connection to connect the ESD's to the internal Power Grid (M6, M7, M8, MD), and in the case of a Flip-Chip, using an ESD bump connection directly to the package the power plane.

* * * * *